United States Patent
Charles et al.

(10) Patent No.: US 7,498,198 B2
(45) Date of Patent: Mar. 3, 2009

(54) STRUCTURE AND METHOD FOR STRESS REDUCTION IN FLIP CHIP MICROELECTRONIC PACKAGES USING UNDERFILL MATERIALS WITH SPATIALLY VARYING PROPERTIES

(75) Inventors: Sylvie S. Charles, Bromont (CA); David D. Danovitch, Canton de Granby (CA); Sylvain S. E. Ouimet, St-Hurbert (CA); Julien J. Sylvestre, Chambly (CA)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/742,120

(22) Filed: Apr. 30, 2007

(65) Prior Publication Data
US 2008/0265435 A1    Oct. 30, 2008

(51) Int. Cl.
*H01L 21/00* (2006.01)
*H01L 21/48* (2006.01)
*H01L 21/50* (2006.01)

(52) U.S. Cl. .................. 438/108; 438/118; 257/E21.54

(58) Field of Classification Search ................. 438/108, 438/118; 257/E21.54
See application file for complete search history.

(56) References Cited

U.S. PATENT DOCUMENTS

| | | | |
|---|---|---|---|
| 6,265,673 B1 * | 7/2001 | Higashida et al. | 174/260 |
| 6,448,665 B1 * | 9/2002 | Nakazawa et al. | 257/789 |
| 6,501,171 B2 * | 12/2002 | Farquhar et al. | 257/706 |
| 6,692,611 B2 * | 2/2004 | Oxman et al. | 156/275.5 |
| 6,803,256 B2 * | 10/2004 | Buchwalter et al. | 438/121 |
| 2005/0233571 A1 * | 10/2005 | Tao et al. | 438/614 |
| 2006/0197229 A1 * | 9/2006 | Osumi et al. | 257/773 |
| 2006/0208356 A1 * | 9/2006 | Yamano et al. | 257/734 |
| 2007/0236890 A1 * | 10/2007 | Coffin et al. | 361/705 |
| 2008/0054490 A1 * | 3/2008 | McLellan et al. | 257/778 |
| 2008/0237840 A1 * | 10/2008 | Alcoe et al. | 257/706 |

* cited by examiner

*Primary Examiner*—Ngan Ngo
(74) *Attorney, Agent, or Firm*—Cantor Colburn LLP; B. Paul Barrett

(57) ABSTRACT

A structure for a flip chip package assembly includes: a flip chip die with solder attach bumps; a substrate for receiving and solder attaching the flip chip die; an underfill material with spatially varying curing properties applied to fill voids between the flip chip die and the substrate, and for forming a fillet around the perimeter of the flip chip die and extending to the surface of the substrate; and wherein the portion of the underfill material forming the fillets is cured prior to curing the portion of the underfill material that fills the voids between the flip chip die and the substrate.

7 Claims, 3 Drawing Sheets

STRUCTURE AND METHOD FOR STRESS REDUCTION IN FLIP CHIP MICROELECTRONIC PACKAGES USING UNDERFILL MATERIALS WITH SPATIALLY VARYING PROPERTIES

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates generally to flip chip technology, and more particularly to providing a structure and method for reducing internal package stresses and improving module coplanarity in flip chip packages by spatially varying underfill properties.

2. Description of the Background

The packaging industry has adopted the widespread use of flip chip technology for high performance applications, at the expense of other packaging solutions, such as wirebonding, which do not offer the same level of interconnect density, electrical performance, or thermal management capabilities. In a flip chip package, the semiconductor die is bumped with individual conducting pads over its entire area. These pads are connected to corresponding pads on a substrate using small solder balls, called controlled collapse chip connections (C4). The pads on the substrate are connected to circuitry that routes the electrical signals to an array of conductors (ball grid arrays (BGA), column grid arrays (CGA) or land grid arrays (LGA)) for the connection to the printed circuit board. The backside of the die is exposed in a flip chip package, and is available for establishing a thermal connection to a heat sink in order to control the die temperature. Flip chip packages with high interconnect counts (about 9000) and large thermal power dissipation capabilities (about 200 W) are currently available.

Recent years have witnessed important changes in the flip chip technology, such as the change from ceramic substrates to lower cost, higher performance organic substrates, and the transition to lead-free soldering alloys. Semiconductor technologies have also been evolving rapidly, with smaller feature sizes, and lower-K dielectric materials, for instance. Many interactions between these changing parameters have been observed to lead to important failure mechanisms that had to be fixed in order to preserve the package reliability. Further, the aforementioned interconnect counts in flip chip packaging continues to increase, resulting in smaller interconnects and larger die, both of which increase the stresses imparted on the interconnections.

The open spaces between the flip chip surface and the substrate is filled with a non-conductive adhesive "underfill" material to protect the bumps (C4 interconnections) and the flip chip surface from moisture, contaminants, and other environmental hazards. More importantly, this underfill material mechanically locks the flip chip surface to the substrate, thereby reducing the strains imposed on the small C4 interconnects by the difference between the coefficient of thermal expansion (CTE) of the flip chip and the substrate. The underfill consequently prevents the C4 interconnects from being damaged during thermal excursions of the module. Flip-chip underfilling is generally achieved by needle dispensation along the edges of the flip-chip. Capillary action draws the dispensed underfill inwards, until the open spaces between the C4 interconnects are filled. Thermal curing of the underfill is performed to form a permanent bond.

The underfill coupling of a chip to a substrate is normally performed at high curing temperatures (approximately 150° C.), where both the chip and the substrate are relatively flat and stress free. During the cooling of the package back to room temperature, differences in CTE between chip and substrate result in different changes in dimension from thermal contraction. This leads to package warpage, and to stress in various critical structures (C4 interconnects, laminate copper structures, etc.). When the substrate is an organic laminate, the differences in CTE are especially significant, exacerbating these problems, especially in areas furthest from the chip geometrical center (the neutral point). Organic laminates typically have CTE's of about 15-20 ppm/° C. or larger, while the CTE of a typical semiconductor die is in a range of less than 5 ppm/° C.

FIG. 1A is a cross sectional view of a typical flip chip assembly 100 with a die 102 attached with C4 interconnections 106 to a substrate 104. A heat cured underfill material 108 fills the spaces between the C4 interconnections 106 in the gap between the die and substrate, and also forms a fillet 110 around the perimeter of the die 102. At room temperature the die 102 has a side length defined as 1, and the substrate 104 has a side length defined as L. FIG. 1B is a cross sectional view of the ball grid array assembly 100 at an elevated temperature for curing the underfill 108. At the elevated curing temperature, the length 1 of the die 102 increases to 1', and the length L of the substrate 104 increases to L'. However, due to the greater overall increase in length L' versus length 1' resulting from the substrate having a larger CTE than the die, a warping results in the assembly 100 as it cools down to room temperature after the underfill curing at the elevated temperature. FIG. 1C illustrates the warpage, in an exaggerated manner, as the assembly 100 returns to room temperature, and the substrate 104 and die 102 undergo different amounts of thermal contraction. Therefore, there is a need for structures and methods for mitigating the warpage of flip package assemblies due to the high temperature curing of the underfill material.

SUMMARY OF THE INVENTION

Embodiments of the present invention include a structure and method for forming a flip chip package assembly, wherein the structure includes: a flip chip die with solder attach bumps; a substrate for receiving and solder attaching the flip chip die; an underfill material with spatially varying curing properties applied to fill voids between the flip material with spatially varying curing properties applied to fill voids between the flip chip die and the substrate, and for forming a fillet around the perimeter of the flip chip die and extending to the surface of the substrate; and wherein the portion of the underfill material forming the fillets is cured prior to curing the portion of the underfill material that fills the voids between the flip chip die and the substrate.

A method for utilizing an underfill material in a flip chip package assembly is also provided, the method includes: applying an underfill material with spatially varying curing properties to fill voids between a flip chip die and a substrate of the flip chip package assembly, and for forming a fillet around the perimeter of the flip chip die and extending to the surface of the substrate; and curing the underfill material forming the fillets prior to curing the portion of the underfill material that fills the voids between the flip chip die and the substrate.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, a solution is technically achieved for providing a structure and method for reducing package warpage and stress by spatially varying underfill properties. The underfill is divided into two zones: the uniform layer under the chip, and the fillets around the perimeter of the chip. The fillet is cured before the layer under the chip. The fillet curing may be achieved either by means of using a line of sight cure that affects only the fillet or by means of using a fillet material whose properties are different from the layer under the chip such that a cure may be achieved earlier for the fillet, or by any combination of the aforementioned means. The cured fillet acts as a frame that restricts differences in thermal expansion between the chip and the substrate during the high temperature cure of the layer of underfill beneath the chip. The result is a reduction in warpage and stress in the flip chip package at room temperature.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF SPECIFIC EMBODIMENTS

Embodiments of the present invention provide a structure and method for reducing stresses in flip chip interconnections by spatially varying underfill properties. The underfill is divided into two zones: the uniform layer under the chip, and the fillets around the perimeter of the chip. The fillet is cured before the layer under the chip. The fillet curing may be achieved either by means of using a line of sight cure that affects only the fillet or by means of using a fillet material whose properties are different from the layer under the chip such that a cure may be achieved earlier for the fillet, or by any combination of the aforementioned means. The cured fillet acts as a frame that restricts differences in thermal expansion between the chip and the substrate during the high temperature cure of the layer of underfill beneath the chip. The result is a reduction ill warpage and stress in the flip chip package at room temperature.

Figure 2:
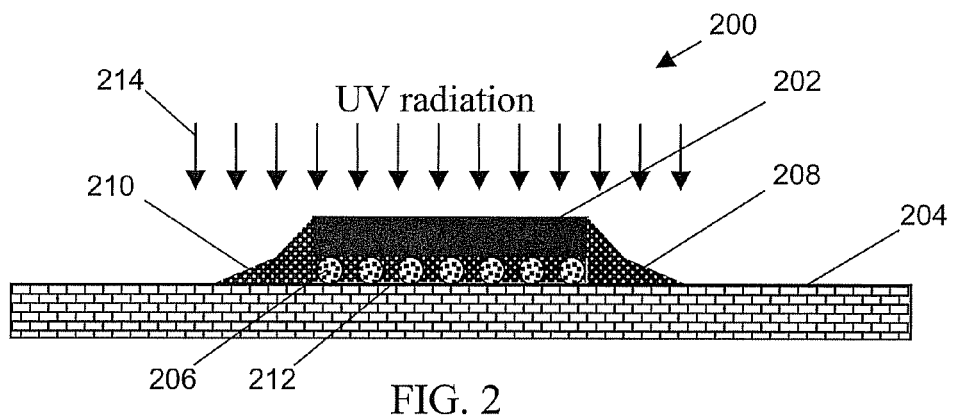
FIG. 2 is a cross sectional view of a flip chip assembly with a single underfill material that is both heat and ultraviolet (UV) curable according to an embodiment of the present invention.

FIG. 2 is a cross sectional view of a flip chip assembly 200 with an underfill material 208 that is both heat and ultraviolet (UV) curable according to an embodiment of the present invention. The underfill material 208 is dispensed to fill the gap 212 between the flip chip die 202 that has been soldered to the laminate 204 with the C4interconnections 206, and to form fillets 210. Exposing the assembly 200 to UV radiation 214 at a low temperature (e.g., room temperature or slightly higher) cures the fillets 210 but not the underfill material 208 that fills the gap 212 between the flip chip die 202 and the substrate 204 since this underfill material 208 is shield from the UV radiation 214 by the flip chip die and therefore cannot be cured radiatively. The assembly 200 is subsequently heated (about 150° C., for instance) to cure the underfill material 208 that fills the gap 212 between the die 202 and the substrate 204. The thermal expansion of the substrate 204 during the elevated heat curing of the underfill material 208 is somewhat limited by the cured fillets 210. When the assembly 200 is cooled back to room temperature after heat curing of the underfill material, the difference in structural contraction between the flip chip die 202 and the substrate 204 is smaller than it would have been had the fillets 210 not been cured prior to temperature curing. As a result there is a reduction in package warpage and inherent stresses. In addition, the fatigue life of the interconnections (ball grid array (BGA), for example) between the package assembly 200 and any card or board to which it is assembled is extended as well.

Figure 3:
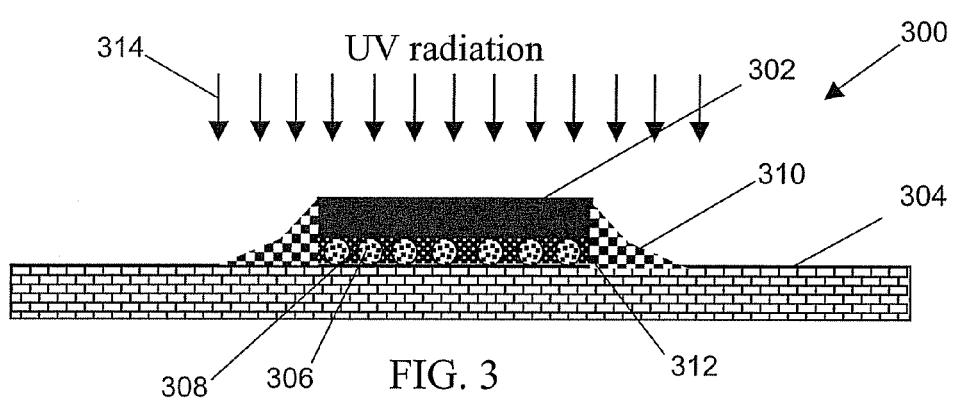
FIG. 3 is a cross sectional view of a flip chip assembly formed with two underfill materials, one that is heat curable and one that is UV curable according to an embodiment of the present invention.

In a second embodiment of the invention as illustrated in FIG. 3 an assembly 300 has an underfill layer 308 and fillet material 310 that are composed of separate materials (differing chemical compositions) that are heat curable and ultraviolet (UV) curable, respectively. The heat curable underfill layer material 308 is dispensed first to just fill the gap 312 between the flip chip die 302 that has been soldered to the substrate 304 with the c4 interconnections 306. Next, the UV curable fillets 310 are formed around the parameter of the flip chip die 302. Exposing the assembly 300 to UV radiation 314 at a low temperature (room temperature or slightly higher) cures the fillets 310. The underfill material 308 within the gap 312 will not cure since it requires heating to be cured. The assembly 300 is subsequently heated to cure the underfill layer material 308 that fills the gap 312 between the die 302 and the substrate 304. The underfill material 308 within the gap 312 requires heating to be cured since it is shielded from the UV radiation 314 by the flip chip die 302. In a similar fashion to the first embodiment of FIG. 2, the thermal expansion of the substrate 304 is somewhat limited by the cured fillets 310, during the elevated heat curing of the underfill layer material 308. When the assembly 300 is cooled back to room temperature, the difference in structural contraction between the flip chip die 302 and the substrate 304 is smaller than it would have been had the fillets 310 not been cured prior to temperature curing. As a result there is a reduction in package warpage and inherent stresses. In addition, the fatigue life of the interconnections (ball grid array (BGA), for example) between the package assembly 300 and any card or board to which it is assembled is extended as well.

Figure 4:
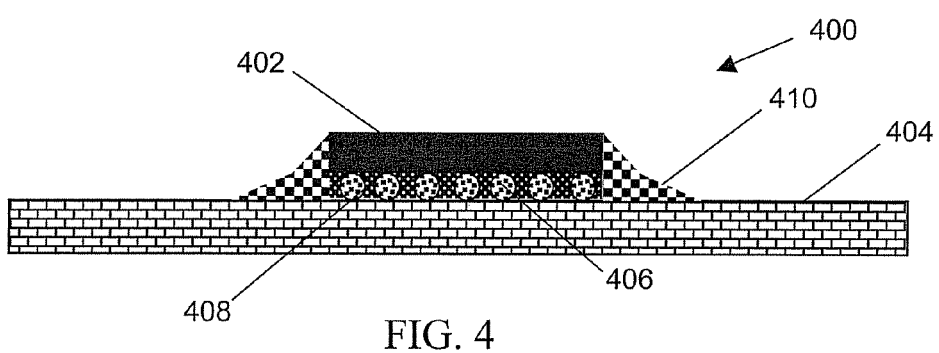
FIG. 4 is a cross sectional view of a flip chip assembly formed with two underfill materials that have different heat curing threshold temperatures according to an embodiment of the present invention.

FIG. 4 illustrates an embodiment of the invention that utilizes underfill materials with different curing temperatures to reduce package warpage and inherent stresses in flip chip package assemblies. The assembly 400 has underfill fillets 410 that are heat cured at a first temperature T1, while underfill layer material 408 between flip chip die 402 and laminate 404 is heat cured at a second temperature T2, where temperature T2 is greater than T1 (T2>T1).

The heat curable underfill layer material 408 is dispensed first to just fill the gap 412 between the flip chip die 402 that has been soldered to the substrate 404 with the C4 interconnections 406. Next, the heat curable fillets 410 are formed around the perimeter of the flip chip die 402. The assembly 400 is then heated to an intermediate temperature equal to T1 (about 80° C., for instance) to cure the heat curable fillets 410. The temperature is then raised to the temperature T2 (about 150° C., for instance) to cure the underfill layer material 408. In a similar fashion to the first two embodiments of FIGS. 2 and 3, the thermal expansion of the substrate 404 is somewhat limited by the cured fillets 410, during the elevated heat curing of the underfill layer material 408. When the assembly 400 is cooled back to room temperature, the difference in structural expansion between the flip chip die 402 and the substrate 404 is smaller than it would have been had the fillets 410 not been cured prior to temperature curing. As a result, there is a reduction in package warpage and inherent stresses. In addition, the fatigue life of the interconnections (ball grid array (BGA), for example) between the package assembly 200 and any card or board to which it is assembled is extended as well.

Figure 5:
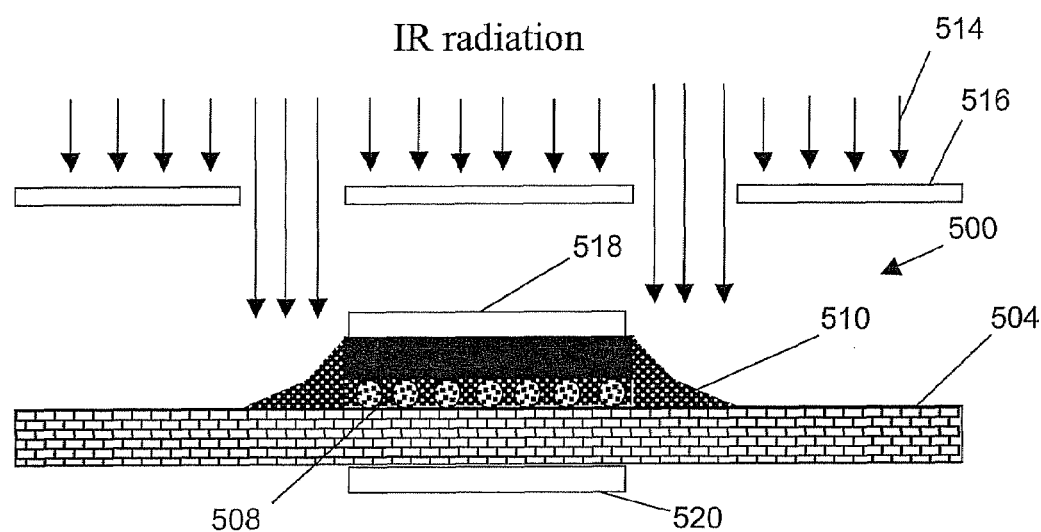
FIG. 5 is a cross sectional view of a flip chip assembly formed with two underfill materials, one that is heat curable and one that is infrared (IR) curable according to an embodiment of the present invention.

FIG. 5 illustrates an embodiment of the invention that utilizes infrared (IR) radiation to cure a single underfill material 508 to reduce package warpage and inherent stresses in flip chip package assemblies. The assembly 500 is selectively heated with shields 516 that direct and concentrate the IR radiation 514 to heat and cure the underfill fillets 510. Optional cold plates (518, 520) can also be placed above the flip chip die 502, and below the substrate 504 in the proximate footprint of the flip chip die 502, to dissipate any heat related to the IR radiation 514 and thus prevent premature curing of the underfill material 508 that lies between the flip chip die 502 and the substrate 504. The assembly 500 is then heated by raising the ambient temperature to cure the unexposed underfill material 508. In a similar fashion to the previously mentioned embodiments of the invention, the staged curing of the underfill contributes to a reduction in the warpage and inherent stresses of the flip chip package assembly 500.

Figure 1A:
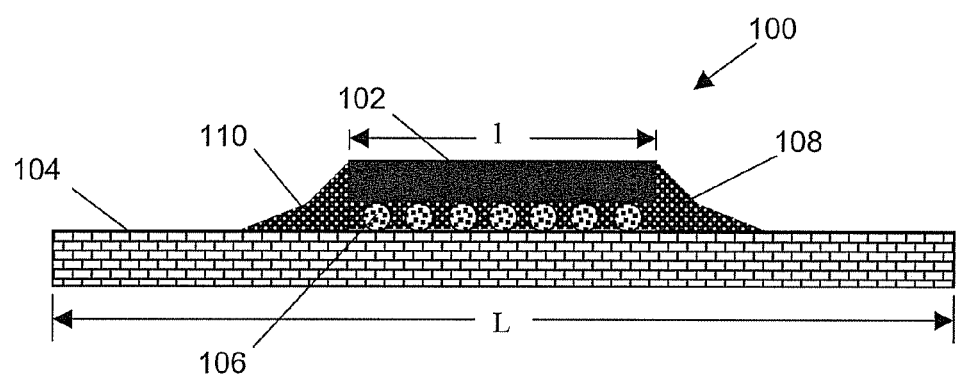
FIGS. 1A-1C are cross sectional views of a typical flip chip assembly under varying temperature conditions, with a single heat cured underfill material filling the gaps between the die and substrate and also forming the fillet.
Figure 1B:
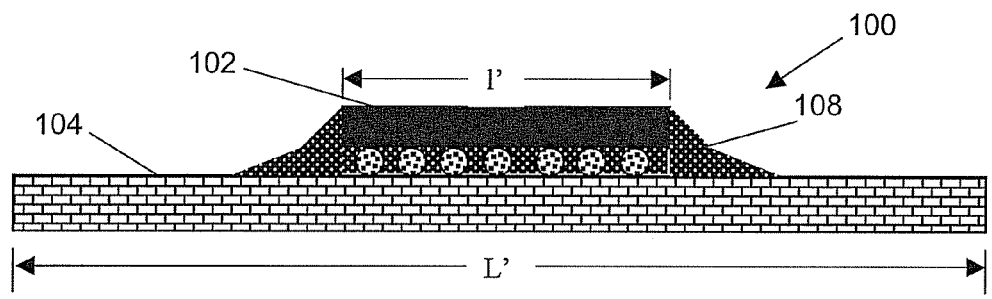
Figure 1C:
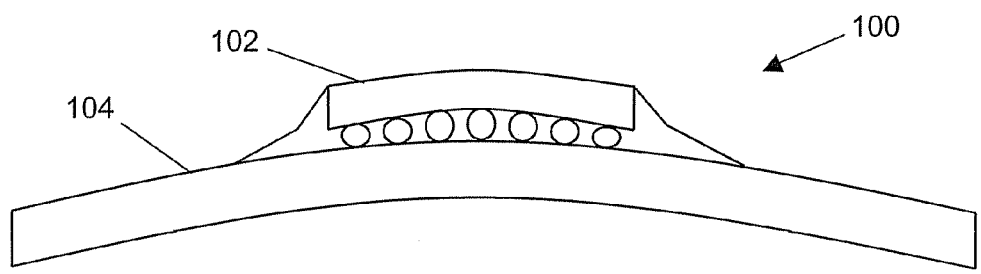
Figure 6A:
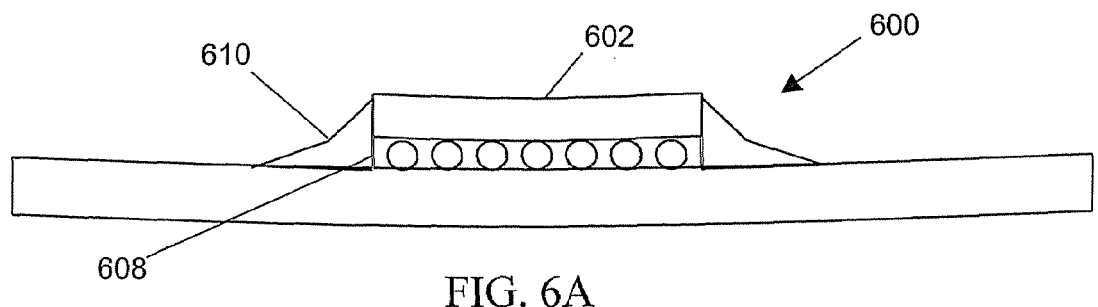
FIGS. 6A and 6B are cross sectional views with the fillets initially cured with UV, IR, or heating at an intermediate temperature, and the underfill layer material cured by heating at an elevated temperature; and at a return to room temperature, respectively according to an embodiment of the present invention.
Figure 6B:
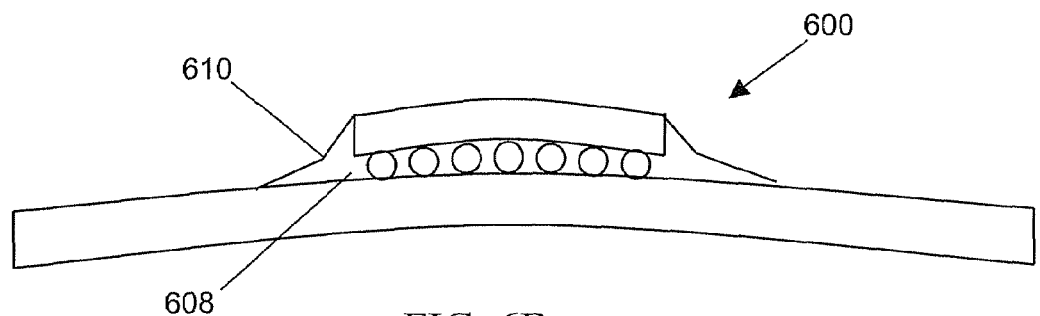

FIGS. 6A and 6B are cross sectional views with the fillets 610 initially cured with UV, IR, or heating at an intermediate temperature, and the underfill layer material 608 cured by heating at an elevated temperature; and at a return to room temperature, respectively according to an embodiment of the present invention. FIG. 6A illustrates the state of the flip chip package assembly 600 at the elevated curing temperature for underfill layer 608 with the fillets 610 already cured, thereby limiting differences in chip and substrate expansion under the flip chip die 602. There is a slight upward warpage when the assembly 600 is heated during the curing of the underfill layer material 608. In FIG. 6B, the assembly 600 is returned to room temperature after underfill layer 608 cure, and a slight warpage is evident in the downward direction. However, the warpage is less than what would have occurred if the fillets 610 had not been cured prior to underfill layer material 608 curing, as is the case in the present state of the art (see FIG. 1C).

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A method for utilizing an underfill material in a flip chip package assembly, the method comprising:
    applying an underfill material with spatially varying curing properties to fill voids between a flip chip die and a substrate of the flip chip package assembly, and for forming a fillet around the perimeter of the flip chip die and extending to the surface of the substrate; and
    curing the underfill material forming the fillets prior to curing the portion of the underfill material that fills the voids between the flip chip die and the substrate.

2. The method of claim 1, wherein the portion of the underfill material forming the fillet is cured at a temperature T1, which is lower than the temperature T2 for curing the underfill material that fills the voids between the flip chip die and the substrate.

3. The method of claim 1, wherein the portion of the underfill material forming the fillet is ultraviolet (UV) cured, and the underfill material that fills the voids between the flip chip die and the substrate is heat cured.

4. The method of claim 1, wherein the portion of the underfill material forming the fillet is cured with infrared (IR) radiation, and the underfill material that fills the voids between the flip chip die and the substrate is heat cured.

5. The method of claim 4, wherein shields are used to concentrate and direct the IR radiation to selectively heat and cure the fillets.

6. The method of claim 4, wherein cold plates are placed above the flip chip die, and below the substrate in the proximate footprint of the flip chip die, to dissipate any heat related to the IR radiation.

7. The method of claim 1, wherein the underfill material obtains its spatially varying properties through a first application of a first underfill material to fill the voids between the flip chip die and the substrate, and a second application of a second underfill material to form the fillets; and
    wherein the first underfill material and the second underfill material are formed from different chemical compositions.

* * * * *